Figure 1A:
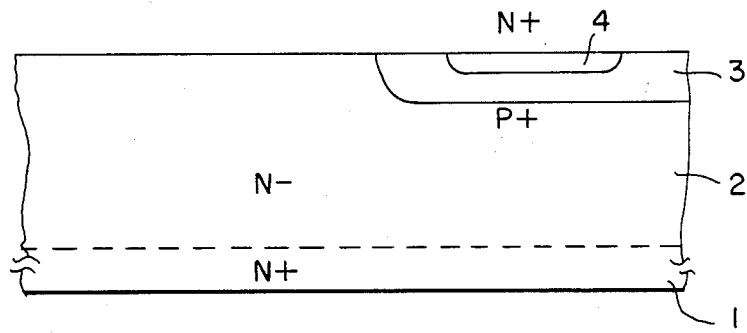

United States Patent [19]

Musumeci et al.

[11] Patent Number: 4,780,430
[45] Date of Patent: Oct. 25, 1988

[54] PROCESS FOR THE FORMATION OF A MONOLITHIC HIGH VOLTAGE SEMICONDUCTOR DEVICE

[75] Inventors: Salvatore Musumeci, Riposto; Raffaele Zambrano, Mercato San Severino, both of Italy

[73] Assignee: SGS Microelettronica S.p.A, Catania, Italy

[21] Appl. No.: 101,430

[22] Filed: Sep. 28, 1987

[30] Foreign Application Priority Data

Oct. 1, 1986 [IT] Italy .................................. 6613 A/86

[51] Int. Cl.$^4$ ............................................. H01L 21/20
[52] U.S. Cl. .......................................... 437/51; 437/54; 437/31; 437/30; 437/154
[58] Field of Search ...................... 437/51, 54, 55, 30, 437/31, 154; 357/46, 48, 51

[56] References Cited

U.S. PATENT DOCUMENTS

| | | | |
|---|---|---|---|
| 4,458,158 | 7/1984 | Mayrand | 307/270 |
| 4,641,171 | 2/1987 | Bertotti et al. | 357/46 |
| 4,667,393 | 5/1987 | Ferla et al. | 437/54 |
| 4,721,684 | 1/1988 | Musumeci | 437/51 |

*Primary Examiner*—Brian E. Hearn
*Assistant Examiner*—T. N. Quach
*Attorney, Agent, or Firm*—Birch, Stewart, Kolasch & Birch

[57] ABSTRACT

The invention concerns a process for formation of a high voltage monolithic semiconductor device that contains at least one power transistor and an integrated control circuit integrated in a single chip. The device is formed by means of a triple epitaxy which utilizes the same doping agent and by growth of the third epitaxial layer with a concentration of impurities greater than the previous ones. By spreading the buried layers till they penetrate inside the third epitaxial layer, collector regions of transistors in the integrated control circuit are obtained free of unwanted intermediate layers or phantom layers caused by the outdiffusion of doping substance present in the heavily doped isolation region with conductivity of the opposite type. Finally PN junctions are formed for the collector region of a power transistor and for the isolation zone of the integrated control circuit, capable of withstanding high voltages.

10 Claims, 3 Drawing Sheets

FIG. 2
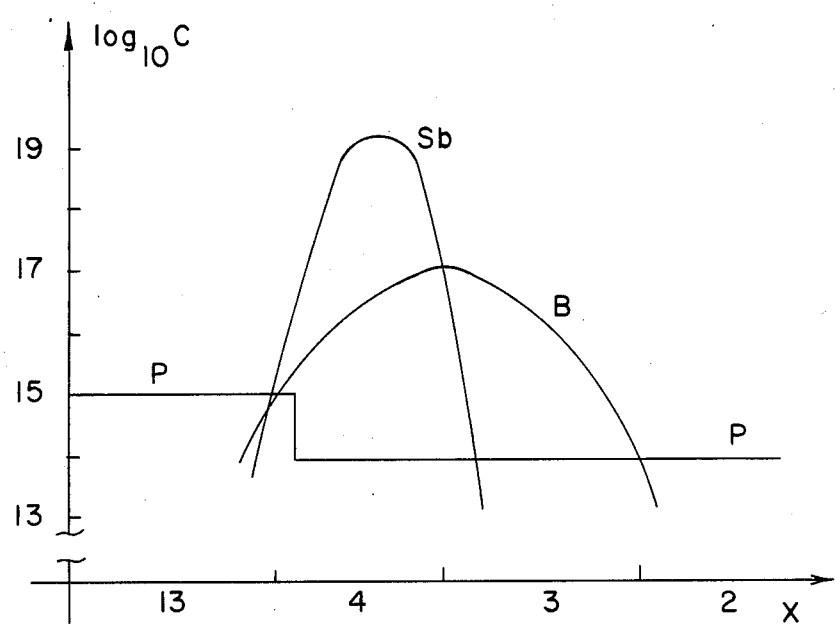
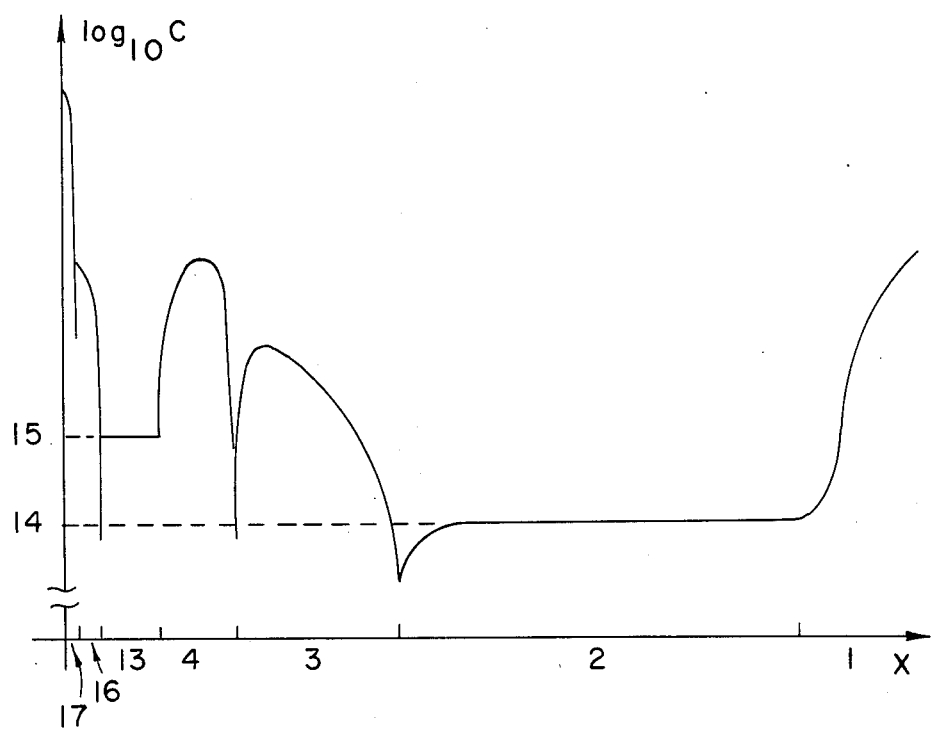
FIG. 3

PROCESS FOR THE FORMATION OF A MONOLITHIC HIGH VOLTAGE SEMICONDUCTOR DEVICE

The present invention concerns a process for producing electronic semiconductor devices which, associated on the same chip, comprise an integrated control circuit and high voltage power components.

In such monolithic devices there is the problem of having collector regions possessing different and optimum characteristics both for the transistors in the integrated control circuit and for the power transistors.

As is well known, to reduce the collector series resistance of a transistor in the integrated control circuit, a buried layer is included in its collector region. If this buried layer is formed on a highly doped layer with impurities of opposite conductivity, the phenomenon of out-diffusion will occur because the dopant present in this latter layer diffuses into the buried layer and into the collector region above it.

Modifications take place in that part of the collector region bordering on the buried layer since undesired "intermediate" layers, also called "phantom" layers, form in said part. Conductivity of these layers is in fact opposite to that which there must be in a buried layer and in the collector region above it.

On account of the harmful effects of the out-diffusion referred to above, a great deal of effort has been devoted to trying to reduce it or, at least, to eliminate the effects it produces. One known method lessens out-diffusion by lowering manufacturing temperatures. Another and also well known method works by controlling within a very narrow interval of variation the concentrations of doping agents and also operating times and temperatures, but manufacturing processes for making the device are so critical that, industrially speaking, they are anti-economic. In a further well known method, described in the patent application in the name of SGS filed in Italy on Dec. 20, 1984 under No. 6633 A/84, the phenomenon of out-diffusion is obviated by formation of a buried layer in which a second dopant of the same conductivity, is added to the principal dopant.

Within the monolithic structures mentioned above, there is also the problem of obtaining collector regions of the power transistors and collector regions of the integrated control circuit transistors with different characteristics.

The main object of this invention is to suggest a process for manufacture of a high voltage monolithic semiconductor device, containing at least one power transistor and an integrated control circuit integrated in one single chip of semiconductor material, that makes it possible to avoid formation of harmful phantom layers, and which enables the best characteristics to be obtained both for the power transistors and for the transistors of the integrated control circuit.

The process according to the invention comprises the following operations:
growth, on a substrate (1) of a first type of conductivity (N), of a first epitaxial layer (2) having the same first type of conductivity, by means of doping with a first doping impurity;
formation, by doping the first epitaxial layer (2) with a second doping impurity, of a first region (3) having a second type of conductivity (P) opposite to the first type;
formation, in the first region (3), of at least a second region (4) by doping with a third doping impurity having the first type of conductivity;
formation, by epitaxial growth, of a second layer (5) having the first type of conductivity with a first doping impurity and with the same characteristics of impurity concentration as those of the underlying first layer (2), so that it entirely covers the aforesaid first layer (2), first region (3) and second region
formation, by epitaxial growth, of a third layer (6) having the first type of conductivity (N), by doping with a first doping impurity, so that it entirely covers the underlying second epitaxial layer (5);
formation of at least one region of isolation (10 and 11), having the second type of conductivity (P), that penetrates the third (6) and second (5) epitaxial layers until the first region (3) is reached and delimiting within it at least a part (13) of the aforesaid third epitaxial layer (6) lying above the second region (4), said second region and part of the aforesaid third epitaxial layer constituting the buried layer and the collector region of a transistor in the control circuit;
formation of a region having the second type of conductivity (P), constituting the base (8) of a power transistor that extends in depth at least beyond the third epitaxial layer (6);
extension of the aforesaid region (8), constituting the base of a power transistor, and of the perimetric region of isolation (11) of the integrated control circuit onto their outer edges by additional lateral regions, by means of impurities having the second type of conductivity (P) and in such a way that the concentration of impurities is caused to decrease towards the edge in accordance with a pre-established profile;
formation, in the base region (8), of a region having the first type of conductivity, constituting the emitter (14) of a power transistor;
formation, in side the collector region (13) of a transistor in the integrated control circuit, of further regions so as to form active and passive elements of the integrated control circuit;
formation of electrodes on the front and back of the chip, and of metal interconnection patterns between active and passive elements of the integrated control circuit and at least one power transistor;
and it is characterized by the fact that the third epitaxial layer (6) doped with a first impurity has a concentration of impurities everywhere constant and greater than of the first (2) and second (5) epitaxial layer and by the fact that said epitaxial collector region (13) of a transistor in the intergrated control circuit is entirely comprised within the third epitaxial layer (6) and by the fact that every, and especially the most perimetric, additional lateral region, both at the base of a power transistor and in the perimeter isolation region of the integrated control circuit, goes beyond the third epitaxial layer.

Figure 1B:
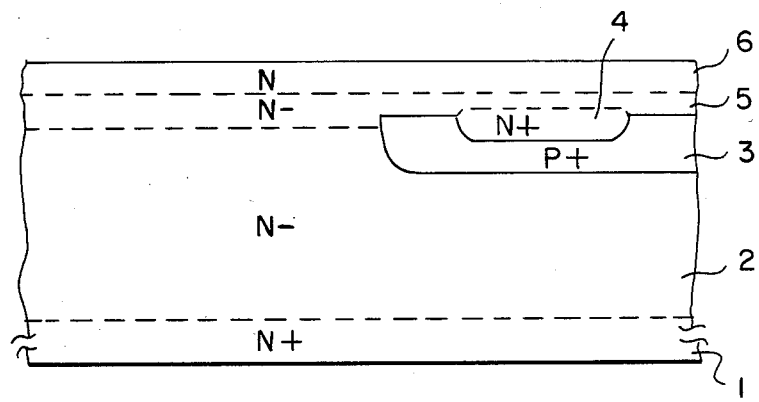
Figure 1C:
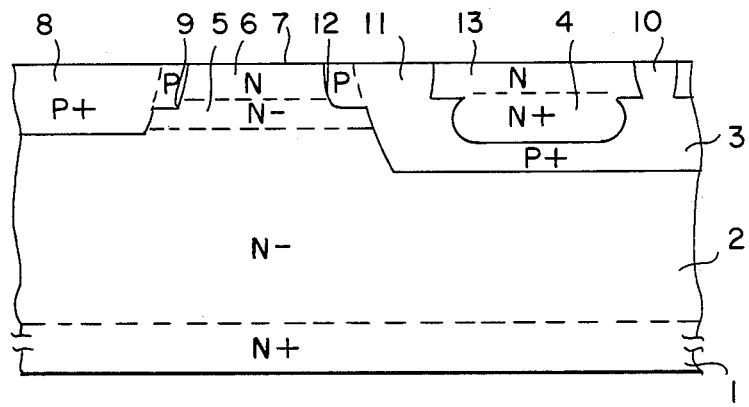
Figure 1D:
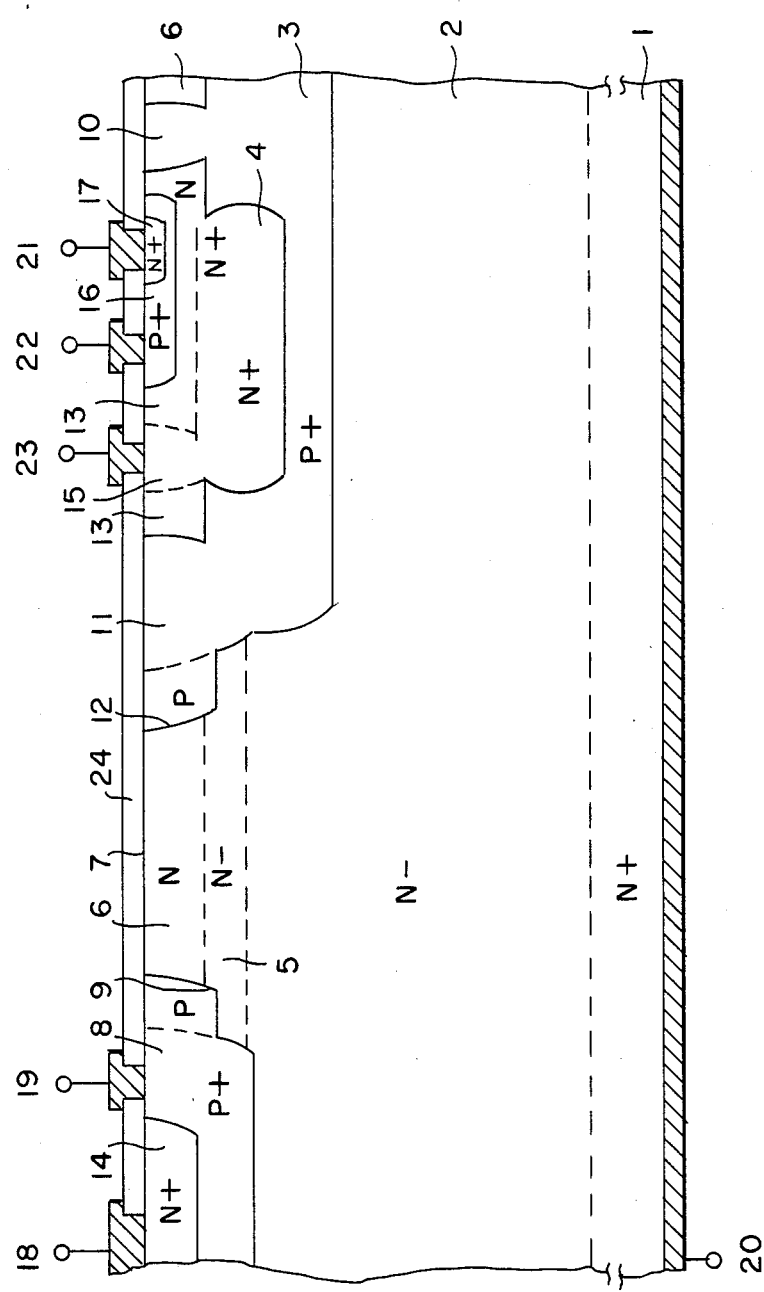

A clearer idea of the invention will be gained from the following description of one of its possible embodiments, given as a non limitative example, read making reference to the attached drawings in which:

FIGS. 1a-1d show section views, not to scale, of a portion of monolithic device comprising a power transistor and a transistor in the integrated control circuit during various phases of the manufacturing process according to the invention;

FIG. 2 gives the curves representing distribution of three doping impurities in one section, not to scale and enlarged, of the device in FIG. 1d, passing through the buried layer and the adjacent regions of a transistor in the integrated control circuit;

FIG. 3 is a graph showing distribution, according to the invention, of the concentration of doping agents in relation to the depth x, along a section, not to scale, of the device in FIG. 1d, passing through the regions of emitter, base, collector, buried layer, insulation region, first epitaxial layer and substrate of the device.

The numbers on the x axis indicate the same regions of the device as indicated in FIG. 1d.

Referring to FIGS. 1a–1d, a process is described according, to the invention, for manufacturing a semiconductor device realized on a single silicon chip and comprising a type NPN power transistor and an integrated control circuit of which an NPN transistor is shown. The electrodes of the two transistors are all on the front of the chip except the power transistor collector which is on the back. Association on a single chip of a power transistor and of an integrated control circuit connected together makes possible the realization of a very compact and efficient monolithic device, in which the integrated circuit represents the low-energy element of control while the power transistor represents the high-energy actuator capable of directly controlling electric motors, solenoids, resistive loads and similar power devices.

The process comprises the following sequence of stages.

STAGE A—An initial epitaxial growth is performed on a single-crystal N+-type silicone substrate 1, of high conductivity so as to form a single-crystal N−-type layer 2, by means of phosphorus, having doping concentration of $1 \times 10^{14}$ atoms/cm$^3$, typical of a collector region of a high voltage transistor.

STAGE B—By means of well known operations of oxidation, photo-masking, etching and diffusion a P+-type region 3, doped with boron, is realized in the epitaxial layer 2, and precisely in an area of the chip destined for the integrated control circuit, having a concentration of $2 \times 10^{17}$ atoms/cm$^3$ on the surface. Said region 3 constitutes the horizontal isolation region of the integrated control circuit.

STAGE C—By the usual operation of oxidation, photo-masking, etching and diffusion, in region 3 a N+-type buried layer 4 is formed, by ionic implantation of antimony at a dose of $1 \times 10^{15}$ atoms/cm$^2$ and its subsequent diffusion inside the region 3 (FIG. 1a).

STAGE D1—Over the whole surface of the chip a second epitaxial growth of single-crystal N− type silicon doped with phospohrus is performed so as to form an epitaxial layer 5 which has a concentration of $1 \times 10^{14}$ atoms/cm$^3$, the same as that of the underlying epitaxial layer 2 (FIG. 1b).

It must be clarified that the two epitaxial layers, 2 and 5, show separated by a dashed line in FIGS. 1b–1d, in actual fact constitute a single single-crystal layer of identical characteristics.

STAGE D2—According to the invention, over the whole surface of the chip a third epitaxial layer of N-type, phosphorus-doped single-crystal silicon, is grown, so as to form an epitaxial layer 6 having a concentration of $1 \times 10^{15}$ atoms/cm$^3$ (FIG. 1b). This layer is different from the underlying epitaxial layers 5 and 2 on account of its higher concentration of phosphorus.

It must be stated that the horizontal isolation region 3 and the buried layer 4 take on the form seen in FIGS. 1b–1d as an effect of epitaxial growths and of the subsequent operations carried out at high temperature to which the silicon chip is subjected during the whole manufacturing process.

Note that a buried layer 4 must preferably expand until it penetrates into the upper epitaxial layer 6 or, at least, until it reaches said layer.

STAGE E—Adopting the usual techniques of oxidation, photomasking, etching and diffusion, below the surface 7 of the device, the P+-type base region 8 of the power transistor, doped with boron, is formed. Using the same type of dopant, formation is made of the lateral P+-type isolation regions 10 and 11, of the transistors in the integrated control circuit.

Said regions 8 and 11, the latter constituting the perimeter lateral isolation region of the integrated control circuit, are extended onto the outer edge of said regions by means of additional lateral regions. These are formed by diffusion of boron in such a way that the concentration of P-type impurities they contain decreases towards the edge according to a previously established profile. Due to the presence of the isolation regions, the transistors in the integrated control circuit are isolated one from another and from the rest of the chip (FIG. 1c). Delimitation is therefore established, in the epitaxial layer 6 comprised between the lateral isolation regions 10 and 11 and the underlying buried layer 4, of an epitaxial region 13 of N-type conductivity constituting the collector region having the desired characteristics of a transistor in the integrated control circuit.

Because of its epitaxial origin, it in fact has an allover constant concentration of impurities whose value is $1 \times 10^{15}$ atoms/cm$^3$. Further, at the boundary with the underlying buried layer 4, it is entirely free of intermediate layers or phantom layers since out-diffusion of the boron, present in the heavily doped isolation region 3, is perfectly balanced by the opposite type of impurity, phosphorus, used to dope the epitaxial layer 6 during its formation and thus the region 13 comprised in it.

Bringing out a further characteristic of the invention, it is worth noting that the aforesaid collector region 13 of a transistor in the integrated control circuit has a concentration of impurities ten times higher than that existing in the epitaxial layers 2 and 5 of equal concentration. These, together with the epitaxial layer 6 outside the isolation zone of the intergrated control circuit and outside substrate 1, constitute the collector region of the power transistor, destined to withstand the high voltage applied to the device (FIG. 1d). Therefore, according to the invention, with the gowth of an epitaxial layer 6, more doped than the previous ones, collector regions of the transistors in the intergrated control circuits and of the power transistors are also obtained with different characteristics.

According to the invention, the drawback relating to higher conductivity of the epitaxial layer 6 compared with that of the underlying epitaxial layers 5 and 2 in the collector region of the power transistor, preventing the monolithic device from withstanding high voltages applied to it, is eliminated by adopting the measures described in the patent application in the name of SGS filed in Italy on Aug. 21, 1984 under number 6616/A/84.

For this purpose the base to collector junctions of the power transistor and isolation zone are formed, comprising the integrated control circuit in accordance with the respective shapes 9 and 12 shown in FIGS. 1c–1d.

STAGE F—At this point in the process, manufacture of the device continues by well-known operations, mention of which is being made to complete the explanation.

Proceeding with the usual techniques, formation is made of the N+-type emitter region 14 of the power transistor and, with the same doping agent, of the N+-type high conductivity region 15 which subsequently is used to form ohmic contact between the collector region 13 of a transistor in the integrated control circuit and a metal electrode (FIG. 1d).

STAGE G—Formation is then made of the P+-type diffused base regions 16 and of the N+-type emitter 17 of the transistors in the integrated control circuit (FIG. 1d).

STAGE H—Finally, the metal contacts are made for the emitter 18, base 19 and collector 20 electrodes of the power transistors, for the emitter 21, base 22 and collector 23 electrodes of the transistors in the integrated control circuit, together with the interconnecting patterns, omitted for simplicity from FIG. 1d, on the silicon dioxide insulating layer 24 formed on the surface 7 of the chip (FIG. 1d).

Reference should be made to FIG. 2 and FIG. 3 for a better evaluation of the process according to the invention, and of how the objects of the invention have been achieved.

FIG. 2 shows three curves that represent concentration trends of boron (B), antimony (Sb) and phosphorus (P) in a section, not to scale, of the device in FIG. 1d passing along the collector region 13, the buried layer 14, the isolation region 3 and the epitaxial layer 2.

Boron (curve B) is the P-type impurity used in diffusion for forming the isolation region 3 of the component parts of the integrated control circuit. Antimony (curve Sb) is the N-type impurity used in implantation and subsequent diffusion to form the buried layer 4 of the transistor in the integrated control circuit.

Phosphorus (dashed line P) is the N-type impurity used in the growth of the various epitaxial layers, and therefore of the collector region 13, to offset the damaging effect of out-diffusion of the boron used for forming the region 3.

It will be seen from FIG. 2, especially if the buried layer 4 penetrates into the epitaxial layer 6, that the phosphorus (P) and the antimony (Sb) taken together are superabundant in the collector region 13 compared with the boron, thus avoiding formation of phantom layers.

FIG. 3 shows the profile of impurities along a section, not to scale, of the device in FIG. 1d, passing through the emitter region 17 and the buried layer 4 of a transistor in the integrated control circuit. The numbers marked along the axis of the x-coordinate are identical to those in FIG. 1d and indicate the layers and regions constituting the monolithic device described. It should be noted how, due to the effect of the invention, the constancy of impurity concentration at any point of the collector region 13 of a transistor in the integrated control circuit is maintained.

To conclude: using the design and manufacturing criteria already known together with the measures described above and which are characteristics of the present invention, a process is realized for producing a monolithic semiconductor device that avoids the drawbacks inherent in known art, making possible, therefore, the production of a minolithic device possessing optimum characteristics and offering optimum performance.

Though only one possible embodiment of the present invention has been here explained and described, it is clear that numerous variations and modifications can be made to it without departing from the gist of the invention.

For example, possessing the properties already indicated, the epitaxial layers 5 and 6 are realized, according to the invention, in a single Stage D. In other words, with reference to FIG. 1b, after growing the epitaxial layer 5 with pre-established characteristics, without removing the wafers from the epitaxial reaction chamber, an epitaxial layer 6, with more dopant than the previous one, can be grown on the epitaxial layer 5 by means of a planned increase in the flow of dopant inside the reaction chamber. Under such conditions growth of the epitaxial layer 6 continues until the previously established thickness has been reached.

To give another example, a variant of the invention can be made by doping the buried layer 4 with arsenic instead of antimony.

As a further example, the invention may be applied to more complex power components such as transistors integrated in a Darlington configuration.

We claim:

1. Process for the manufacture of a monolithic semiconductor device containing at least one power transistor and an integrated control circuit integrated in one single chip of semiconductor material, comprising the following operations:

growth, on a substrate of a first type of conductivity, of a first epitaxial layer having the same first type of conductivity, by means of doping with a first doping impurity;

formation, by doping the first epitaxial layer with a second doping impurity, of first region having a second type of conductivity opposite to the first type;

formation, in the first region, of at least a second region by doping with a third doping impurity having the first type of conductivity;

formation, by epitaxial growth, of a second layer having the first type of conductivity with a first doping impurity and with the same characteristics of impurity concentration as those of the underlying first layer, so that it entirely covers the aforesaid first layer, first region and second region;

formation, by epitaxial growth, of a third layer having the first type of conductivity, by doping with a first doping impurity, so that it entirely covers the underlying second epitaxial layer;

formation of at least one region of isolation, having the second type of conductivity, that penetrates the third and second epitaxial layers until the first region is reached and delimiting within it at least a part of the aforesaid third epitaxial layer lying above the second region, said second region and part of the aforesaid third epitaxial layer constituting the buried layer and the collector region of a transistor in the control circuit;

formation of a region having the second type of conductivity, constituting the base of a power transistor that extends in depth at least beyond the third epitaxial layer;

extension of the aforesaid region, constituting the base of a power transistor, and of the perimetric region of isolation of the integrated control circuit onto their outer edges by additional lateral regions, by means of impurities having the second type of conductivity and in such a way that the concentration of impurities is caused to decrease towards the edge in accordance with a pre-established profile;

formation, in the base region, of a region having the first type of conductivity, constituting the emitter of a power transistor;

formation, inside the collector region of a transistor in the integrated control circuit, of further regions so as to form active and passive elements of the integrated control circuit; and formation of electrodes on the front and back of the chip, and of metal interconnection patterns between active and passive elements of the integrated control circuit and at least one power transistor; characterized by the fact that the third epitaxial layer doped with a first impurity has a concentration of impurities everywhere constant and greater than that of the first and second epitaxial layer and by the fact that said epitaxial collector region of a transistor in the integrated control circuit is entirely comprised within the third epitaxial layer and by the fact that every, and especially the most perimetric, additional lateral region, both at the base of a power transistor and in the perimetric isolation region of the integrated control circuit, goes beyond the third epitaxial layer.

2. Process according claim 1, characterized by the fact that the third epitaxial layer is formed, without removing the wafers from the reaction chamber of the epitaxial reactor, causing epitaxial growth of the second layer to proceed with a planned increase in the concentration of the first doping impurity.

3. Process according to claim 1, characterized by the fact that the concentration of impurities in the collector region of a transistor in the integrated control circuit is everywhere constant and higher than the concentration of the same doping impurity in the first and second epitaxial layer, constituting part of the collector region of a power transistor.

4. Process according to claim 1 characterized by the fact that the ratio value between the concentration of impurities in the first and second epitaxial layers and the concentration of impurities in the collector region of a transistor in the integrated control circuit, lies between one and one hundredth.

5. Process according to claim 1, characterized by the fact that the doping impurity of the first, second and third epitaxial layer is the same.

6. Process according to claim 5, characterized by the fact that the conductivity of the first doping impurity is type N.

7. Process according to claim 2, characterized by the fact that the concentration of impurities in the collector region of a transistor in the integrated control circuit is everywhere constant and higher than the concentration of the same doping impurity in the first and second epitaxial layer, constituting part of the collector region of a power transistor.

8. Process according to claim 2, characterized by the fact that the doping impurity of the first, second and third epitaxial layer is the same.

9. Process according to claim 3, characterized by the fact that the doping impurity of the first, second and third epitaxial layer is the same.

10. Process according to claim 4, characterized by the fact that the doping impurity of the first, second and third epitaxial layer is the same.

* * * * *